United States Patent
Lee et al.

(10) Patent No.: US 10,444,265 B2
(45) Date of Patent: Oct. 15, 2019

(54) METHOD OF EXTRACTING A CURRENT LEVEL FOR RELATING TO THE CUTOFF OF AN INTERCONNECTION

(71) Applicant: SK hynix Inc., Icheon-si, Gyeonggi-do (KR)

(72) Inventors: Chang Hwi Lee, Seoul (KR); Sung Bae Kim, Pyeongtaek-si Gyeonggi-do (KR); Si Woo Lee, Icheon-si Gyeonggi-do (KR); Man Ho Seung, Cheongju-si Chungcheongbuk-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 144 days.

(21) Appl. No.: 15/868,491

(22) Filed: Jan. 11, 2018

(65) Prior Publication Data
US 2019/0018049 A1     Jan. 17, 2019

(30) Foreign Application Priority Data

Jul. 12, 2017 (KR) .................. 10-2017-0088482

(51) Int. Cl.
*G01R 19/30* (2006.01)
*G01R 27/08* (2006.01)
*G01R 19/32* (2006.01)

(52) U.S. Cl.
CPC .............. *G01R 19/30* (2013.01); *G01R 19/32* (2013.01); *G01R 27/08* (2013.01)

(58) Field of Classification Search
CPC ........ G01R 19/30; G01R 19/32; G01R 27/02; G01R 27/08; G01R 29/08–29/0814; G01R 31/001; H01L 23/60; H01L 23/62
See application file for complete search history.

(56) References Cited

U.S. PATENT DOCUMENTS 5,949,694 A * 9/1999 Amerasekera ...... G06F 17/5036
                                                              257/360
8,921,127 B2   12/2014 Frye et al.
(Continued)

OTHER PUBLICATIONS

K.T. Kaschani, Microelectronics Reliability, "What is Electrical Overstress?—Analysis and Conclusions", May 2015, pp. 853-862, vol. 55, Issue 6, Texas Instruments, Haggertystr. 1, 85356 Freising, Germany.

(Continued)

*Primary Examiner* — Huy Q Phan
*Assistant Examiner* — David B Frederiksen
(74) *Attorney, Agent, or Firm* — William Park & Associates Ltd.

(57) ABSTRACT

A current level extraction method for preventing cutoff is disclosed. The method may include starting a voltage sweep to an interconnection structure at a certain temperature, measuring an initial resistance of the interconnection structure, calculating a measured resistance of the interconnection structure according to a corresponding input voltage, determining whether or not a resistance ratio of the measured resistance of the interconnection structure to the initial resistance is equal to or less than a preset value, updating a current value corresponding to measured resistance to a potential maximum current level and repeating the step of calculating the measured resistance when the resistance ratio of the interconnection structure is equal to or less than the preset value, and setting the current value corresponding to the measured resistance as a maximum current level when the resistance ratio of the interconnection structure is greater than the preset value.

13 Claims, 6 Drawing Sheets

(56) References Cited

U.S. PATENT DOCUMENTS

| | | | |
|---|---|---|---|
| 10,289,178 B1* | 5/2019 | Lynam | G06F 1/206 |
| 2004/0239346 A1* | 12/2004 | Iyer | G01R 27/02 |
| | | | 324/713 |
| 2006/0018070 A1* | 1/2006 | Iben | G11B 5/40 |
| | | | 361/91.1 |
| 2010/0253380 A1 | 10/2010 | Martin et al. | |
| 2012/0074978 A1* | 3/2012 | Gentrup | G01R 29/0814 |
| | | | 324/754.19 |
| 2017/0370984 A1* | 12/2017 | Biskeborn | G01R 33/098 |

OTHER PUBLICATIONS

Leonardo Di Biccari et al., IEEE Transactions on Device and Materials Reliability, "Thin-Copper-Metal Interconnection Thermomigration Analysis in ESD Regime", Sep. 2015, pp. 280-288, vol. 15, No. 3, Institute of Electrical and Electronics Engineers (IEEE), Tucson, AZ, USA.

\* cited by examiner

METHOD OF EXTRACTING A CURRENT LEVEL FOR RELATING TO THE CUTOFF OF AN INTERCONNECTION

CROSS-REFERENCES TO RELATED APPLICATION

The present application claims priority under 35 U.S.C. § 119(a) to Korean patent application number 10-2017-0088482 filed on Jul. 12, 2017, in the Korean Intellectual Property Office, which is incorporated herein by reference in its entirety.

BACKGROUND

1. Technical Field

Various embodiments may generally relate to a method of extracting a current in a semiconductor integrated circuit device, and more particularly, to a method of extracting a current level just prior to cutoff of an interconnection due to electrical over stress (EOS).

2. Related Art

In general, EOS may refer to an electric shock due to an abnormal overcurrent or an abnormal overvoltage caused by leakage current and leakage voltage of apparatuses using a power voltage. Failures due to EOS may mean that a pulse width is typically in a range of several tens of μs or more.

Unlike electrostatic discharge (ESD), since EOS has a similar characteristic to a direct current (DC) current, EOS may have relatively large power dissipation. EOS may cause thermal migration in semiconductor integrated circuit devices resulting in cutoff of interconnections.

Currently, a method for preventing cutoff failure in advance by extracting a maximum current level which causes cutoff of interconnections due to EOS has been proposed.

SUMMARY

In an embodiment of the present disclosure, a method of extracting a maximum current level may be provided. The method may include voltage sweeping to an interconnection structure at a certain temperature. The method may include measuring an initial resistance of the interconnection structure. The method may include measuring a resistance of the interconnection structure according to a corresponding voltage input in the voltage sweeping. The method may include determining whether or not a resistance ratio of the resistance of the interconnection structure measured in the voltage sweeping to the initial resistance is equal to or smaller than a preset value. The method may include repeating the step of measuring of the resistance of the interconnection structure when the resistance ratio of the interconnection structure is equal to or less than the preset value. The method may include setting a current value according to the voltage corresponding to the resistance measured in the voltage sweeping as a maximum current level when the resistance ratio of the interconnection structure is greater than the preset value In an embodiment of the present disclosure, a method of extracting a maximum current level may be provided. The method may include voltage sweeping to an interconnection structure at a certain temperature. The method may include measuring a primary current of the interconnection structure according to an input voltage. The method may include measuring a secondary current of the interconnection structure according to a subsequent input voltage. The method may include determining whether or not a current difference is equal to or larger than zero, the current difference obtained by subtracting the primary current from the secondary current. The method may include repeating the steps of measuring the primary current, measuring the secondary current, and determining whether or not the current difference is equal to or larger than zero when the current difference is equal to or greater than zero. The method may include setting the primary current corresponding to the input voltage just prior to the next voltage as the maximum current level when the current difference is less than zero.

In an embodiment of the present disclosure, a method of extracting a maximum current level may be provided. The method may include voltage sweeping to an interconnection structure at a certain temperature. The method may include measuring a primary resistance of the interconnection structure according to a corresponding voltage. The method may include measuring a secondary resistance of the interconnection structure according to next corresponding voltage. The method may include comparing the primary resistance and the secondary resistance to generate a resistance comparison result. The method may include repeating the steps of measuring the primary resistance, measuring the secondary resistance, and comparing the primary resistance and the secondary resistance or setting, with a max current level measurement apparatus, a maximum current level according to the resistance comparison result.

DETAILED DESCRIPTION

Various embodiments of the present invention will be described with reference to the accompanying drawings.

The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims The embodiments should not be construed as limiting the concepts discussed herein. Although a few embodiments will be illustrated and described, it will be appreciated by those of ordinary skill in the art that changes may be made in these embodiments without departing from the principles and spirit of the disclosure.

Figure 1:
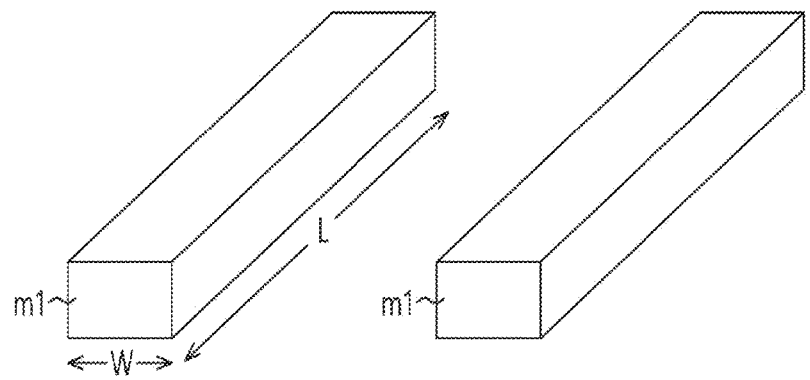
FIG. 1 is a perspective view illustrating an interconnection structure according to an embodiment of the present disclosure.
Figure 2:
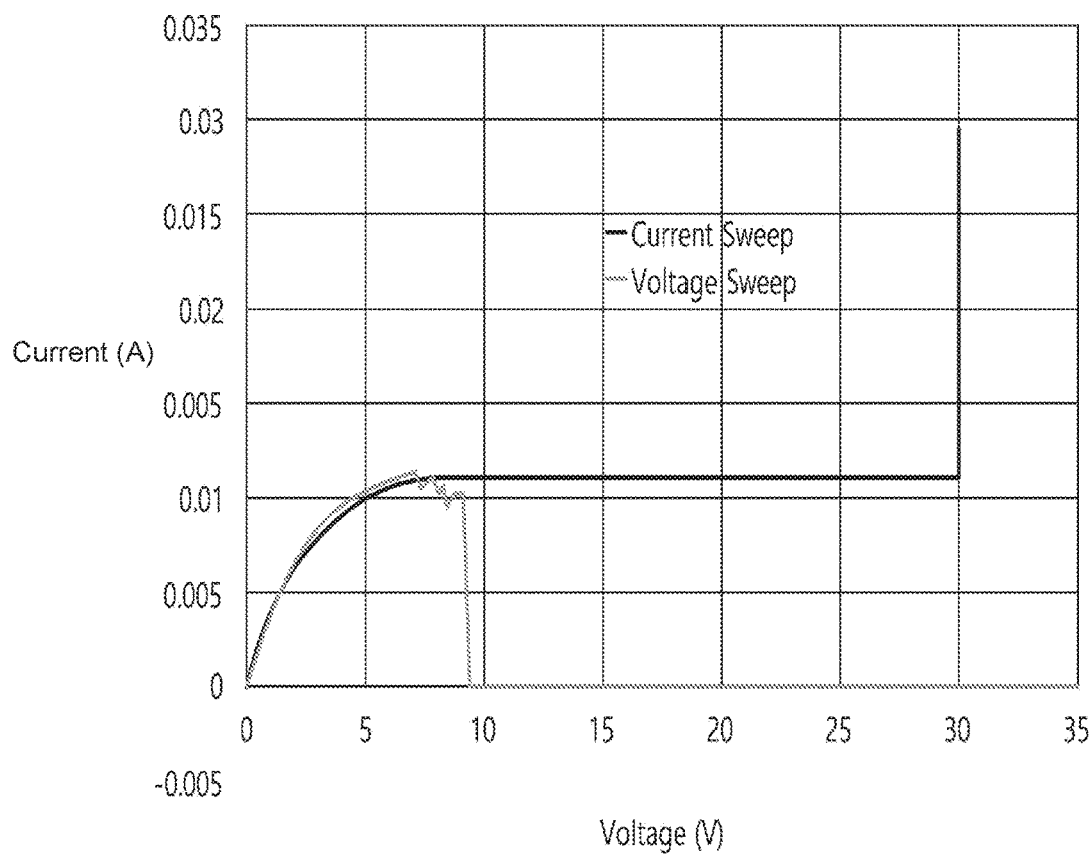
FIG. 2 is a graph illustrating voltage-current sweeping applied to an interconnection structure according to an embodiment of the present disclosure.

FIG. 1 is a perspective view illustrating an interconnection structure according to an embodiment of the present disclosure and FIG. 2 is a graph illustrating voltage-current sweeping applied to an interconnection structure according to an embodiment of the present disclosure.

Referring to FIGS. 1 and 2, EOS may be applied to an interconnection structure m1 having a fixed linewidth W and a fixed length L through voltage sweeping. The current sweeping may be performed to apply EOS to the interconnection structure m1. However, the voltage sweeping may be advantageous in terms of power dissipation.

The current-voltage characteristic may typically have the relationship that the voltage is in linear proportion to the current according to the Ohm's law. However, the current-voltage characteristic may be represented in the log form through thermal migration between the neighboring interconnection structures m1 as illustrated in FIG. 2.

In the embodiment, as illustrated in FIG. 2, the point of time when the current is abruptly increased according to voltage application may be extracted and the current level at the point of time may be set as the maximum current level. Accordingly, the current having the maximum current level or more may be controlled not to be provided to the interconnection structure m1. Accordingly, the cutoff of the interconnection structure due to EOS may be reduced.

Hereinafter, the maximum current level extraction method according to various embodiments will be described.

Figure 3:
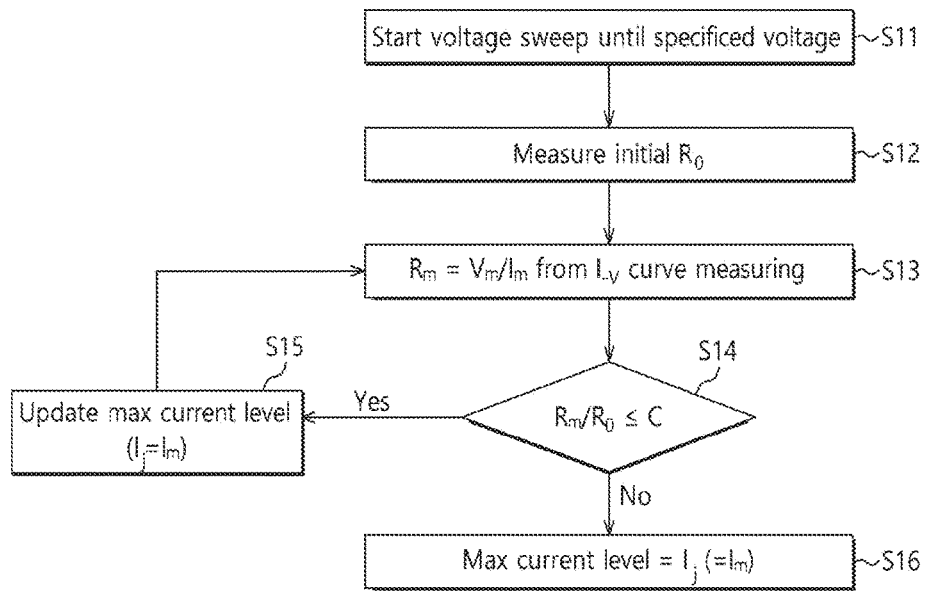
FIG. 3 is a flowchart explaining a maximum current level extraction method according to an embodiment of the present disclosure.
Figure 4:
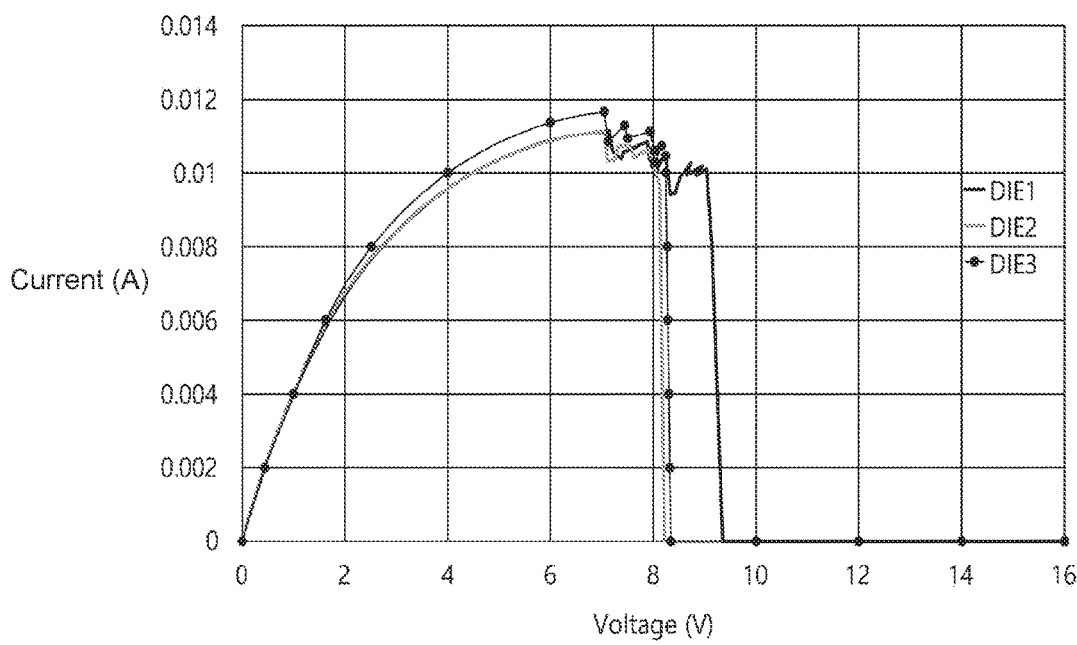
FIG. 4 is a graph illustrating a current-voltage curve in voltage sweeping according to an embodiment of the present disclosure.
Figure 5:
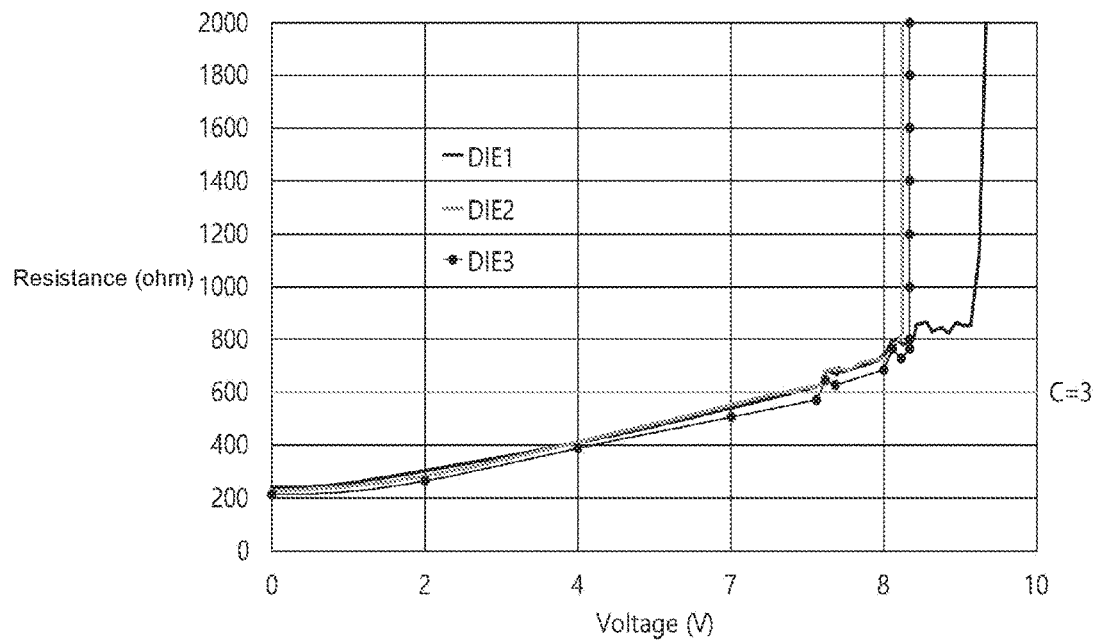
FIG. 5 is a graph illustrating voltage and resistance in the voltage sweeping of FIG. 4.

FIG. 3 is a flowchart explaining a maximum current level extraction method according to an embodiment, FIG. 4 is a graph illustrating a current-voltage curve in voltage sweeping according to an embodiment, and FIG. 5 is a graph illustrating voltage and resistance in the voltage sweeping of FIG. 4. A DIE 1 of FIG. 4 represents a current-voltage curve of an interconnection structure m1 formed in a first die. A DIE 2 of FIG. 4 represents a current-voltage curve of an interconnection structure m1 formed in a second die. A DIE 3 of the FIG. 4 represents a current-voltage curve of an interconnection structure m1 formed in a third die. A DIE 1 of FIG. 5 represents a resistance curve to an input voltage applied to an interconnection structure m1 formed in the first die. A DIE 2 of FIG. 5 represents a resistance curve to an input voltage applied to an interconnection structure m1 formed in the second die. A DIE 3 of FIG. 5 represents a resistance curve to an input voltage applied to an interconnection structure m1 formed in the third die.

Referring to FIG. 3, the voltage sweeping of the interconnection structure (see m1 of FIG. 1) may start until a specific voltage level is reached (S11). For example, the voltage sweep may be to change a level of the voltage applied to the interconnection structure. Further, the voltage sweep of the embodiment is that a voltage rapidly drops after the voltage increase until the specific voltage. The voltage sweeping to the interconnection structure m1 may be performed at room temperature, for example 10° C. to 20° C.

An initial resistance $R_0$ of the interconnection structure m1 may be measured (S12). The initial resistance R0 may be a resistance value of the interconnection structure m1 measured under the room temperature. And then, an input voltage Vm (hereinafter a subsequent input voltage) is simultaneously applied to the interconnection structure m1 until the specific voltage, according to FIG. 4. Through a monitoring apparatus (not shown) including a function for measuring the resistance, in an embodiment, the current value $I_m$ to the input voltage $V_m$ may be obtained as illustrated in FIG. 4 and the resistance value $R_m$ according to the voltage application may be obtained as illustrated in FIG. 5. Thus, the voltage or the current may be provided to the interconnection structure m1 for measuring the resistance value thereof.

A resistance $R_m$ (hereinafter, referred to as measured resistance) of the interconnection structure m1 according to a selected subsequent input voltage $V_m$ may be measured referring to the FIG. 5 (S13). Further, the measured resistance $R_m$ may be obtained as a ratio of a voltage $V_m$ to a current Im through the monitoring result of FIG. 4. For example, the measuring step is performed in the monitoring apparatus (not shown) included in a max current level measurement apparatus (not shown).

Figure 10:
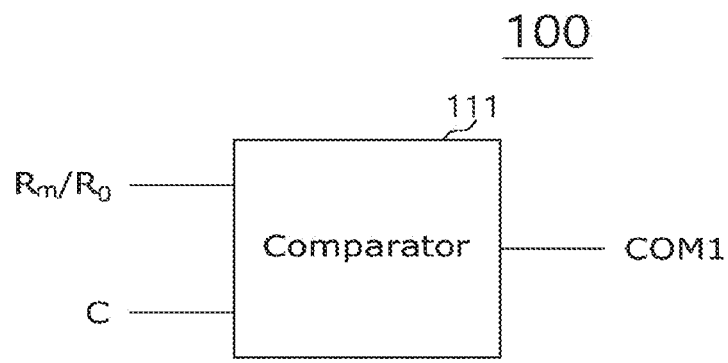
FIG. 10 to FIG. 12 are schematic block diagrams illustrating a monitoring apparatus according to an embodiments of the present disclosure.

A comparison operation for determining whether or not a ratio $R_m/R_0$ of the measured resistance $R_m$ to the initial resistance $R_0$ is equal to or less than a preset value C may be performed (S14). For example, the comparison-step is performed in a comparator (as shown in FIG. 10) included in the max current level measurement apparatus.

When the ratio $R_m/R_0$ of the measured resistance Rm to the initial resistance R0 is equal to or smaller than the preset value C, it may be determined that the measured current $I_m$ corresponding to the measured resistance $R_m$ does not reach a maximum current level $I_j$. An operation for updating the measured current $I_m$ as the potential maximum current level $I_j$ may be performed (S15) and then the process may proceed to operation S13. For example, the updating step is performed in a control apparatus (not shown) included in the max current level measurement apparatus.

Here, the preset value C may be represented as an increment ΔT of the temperature in the interconnection structure from the initial room temperature and the increment ΔT of the temperature may be obtained through the following equation 1.

$$R_m = R_0 \times (1 + TCR \times \Delta T) \quad \text{[Equation 1]}$$

Here, TCR may refer to a temperature coefficient of resistance. When the interconnection structure m1 is a metal, TCR may be controlled in consideration of a property of a material for the interconnection structure m1.

When the resistance ratio $R_m/R_0$ of the current resistance $R_m$ (for example, the measured resistance) to the initial resistance $R_0$ is larger than the preset value C, it may be determined that the current $I_m$ corresponding to the measured resistance Rm is larger than the maximum current level $I_j$. Accordingly, the current level of the current Inn corresponding to the measured resistance $R_m$ prior to the updating may be set as the maximum current level $I_j$ (S16). For example, the setting step is performed in the control apparatus included in the max current level measurement apparatus.

The cutoff due to EOS may be reduced by setting the maximum current level $I_j$ according to the algorithm.

Figure 6:
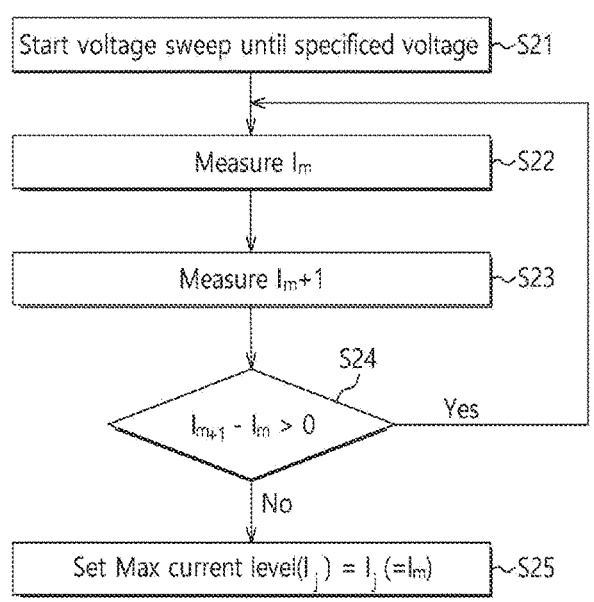
FIG. 6 is a flowchart explaining a maximum current level extraction method according to an embodiment of the present disclosure.
Figure 7:
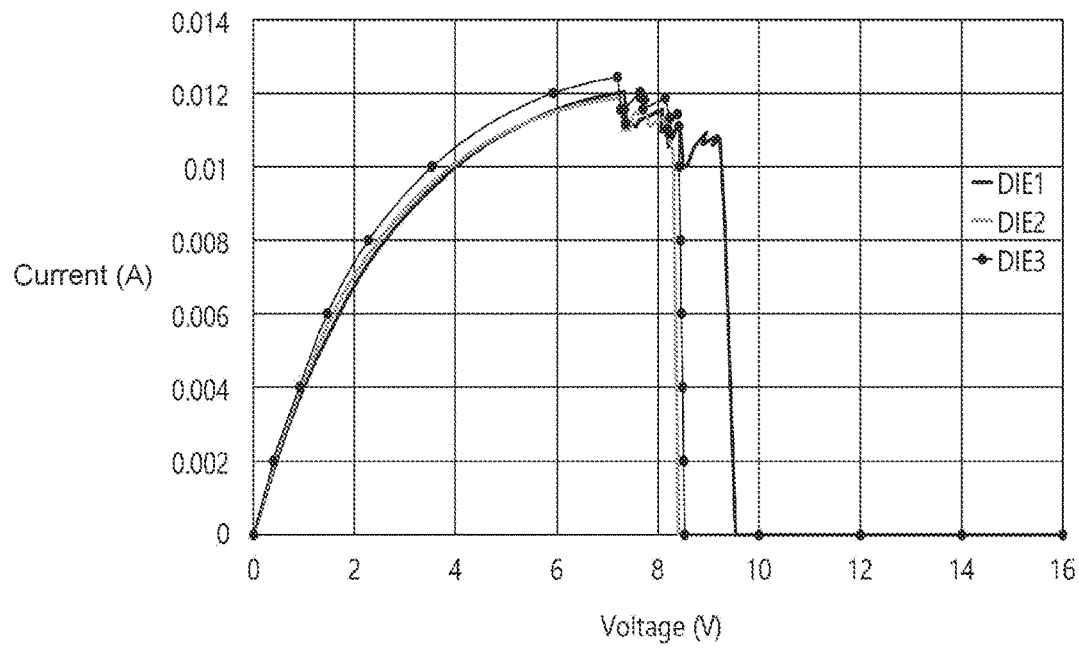
FIG. 7 is a graph illustrating a current-voltage curve in voltage sweeping according to an embodiment of the present disclosure.

FIG. 6 is a flowchart illustrating a maximum current level extraction method according to an embodiment and FIG. 7 is a graph illustrating a current-voltage curve in voltage sweeping according to an embodiment. A DIE 1 of FIG. 7 represents a current-voltage curve of an interconnection structure m1 formed in a first die. A DIE 2 of FIG. 7 represents a current-voltage curve of an interconnection structure m1 formed in a second die. A DIE 3 of the FIG. 7 represents a current-voltage curve of an interconnection structure m1 formed in a third die.

Referring to FIG. 6, the voltage sweeping of the interconnection structure (see m1 of FIG. 1) may start until, after a voltage level increase, a specific voltage level is reached (S21). For example, the voltage sweep may be to change a level of the voltage applied to the interconnection structure. Further, the voltage sweep of the embodiment is that a voltage rapidly drops after the voltage increase until the specific voltage. A current $I_m$ (hereinafter, referred to as primary current) flowing in the interconnection structure m1 according to a corresponding voltage may be measured (S22).

A current $I_{m+1}$ (hereinafter, referred to as secondary current) flowing in the metal interconnection m1 according to a subsequent voltage may be measured (S23). Here, the primary current Inn and the secondary current $I_{m+1}$ may be measured through the current-voltage curve of FIG. 7 provided from a monitoring apparatus included in a max current level measurement apparatus.

An operation for comparing the secondary current Im+1 and the primary current Inn may be performed (S24). When the voltage is continuously swept, the current value may also be increased in proportion to the voltage. Accordingly, when a difference $(I_{m+1}-I_m)$ that the primary current Inn is subtracted from the secondary current Im+1 has a positive value, the interconnection structure m1 may be determined as in a non-cut off state and the process may return to operation S22. For example, the comparison-step is performed in a comparator (not shown) included in the max current level measurement apparatus.

When the difference $(I_{m+1}-I_m)$ that the primary current $I_m$ is subtracted from the secondary current $I_{m+1}$ has a negative value, the current may be reduced in inverse proportion to the applied voltage amount and thus Ohm's law is invalidated. Accordingly, it may be determined that the interconnection structure m1 is in a cut off state. The primary current $I_m$ measured just prior the cutoff may be set as the maximum current level (S25). For example, the setting step is performed in a control apparatus included in the max current level measurement apparatus.

It has been described in an embodiment that when the comparison result between the secondary current $I_{m+1}$ and the primary current Im has a positive value, the process proceeds to operation S22, but the operation of updating the secondary current $I_{m+1}$ to the maximum current level $I_j$ may be performed and simultaneously the process may proceed to operation S23. When the process proceeds to operation S23, the secondary current $I_{m+1}$ before the process proceeds to operation S23, for example, the updated maximum current level $I_j$ may be interpreted as the primary current $I_m$ and next secondary current $I_{m+1}$ may have a current value corresponding to a voltage higher than the next input voltage corresponding to the secondary current just before the process proceeds to operation S23.

It has been described in an embodiment that the maximum current level is set using the measured current value, but this is not limited thereto and the maximum current level may be set using the measured resistance value Rm.

Figure 8:
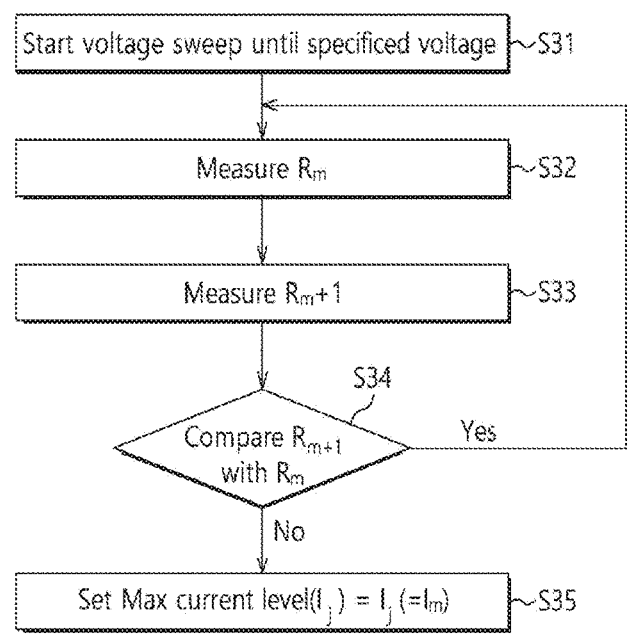
FIG. 8 is a flowchart explaining a maximum current level extraction method according to an embodiment of the present disclosure.

For example, as illustrated in FIG. 8, the voltage sweeping to the interconnection structure (see m1 of FIG. 1) may start until a specific voltage (S31). For example, the voltage sweep may be to change a level of the voltage applied to the interconnection structure. Further, the voltage sweep of the embodiment is that a voltage rapidly drops after the voltage increase until the specific voltage.

A resistance $R_m$ (hereinafter, referred to as primary resistance) of the interconnection structure m1 corresponding to a corresponding voltage may be measured (S32). The primary resistance $R_m$ may be measured from the values illustrated in the current-voltage curve of FIG. 7.

A resistance $R_{m+1}$ (hereinafter, referred to as secondary resistance) of the interconnection structure m1 corresponding to next input voltage may be measured (S33). The secondary resistance $R_{m+1}$ may also be measured from the values illustrated in the current-voltage curve of FIG. 7. For example, the measuring step is performed in the monitoring apparatus (not shown) included in a max current level measurement apparatus (not shown).

An operation for comparing the secondary resistance $R_{m+1}$ and the primary resistance Rm may be performed (S34). For example, the comparison-step is performed in a comparator (not shown) included in the max current level measurement apparatus.

The comparison between the secondary resistance $R_{m+1}$ and the primary resistance $R_m$ may be performed through an operation for determining whether or not a ratio of the secondary resistance $R_{m+1}$ to the primary resistance Rm is equal to or larger than a fixed value.

The comparison operation between the secondary resistance $R_{m+1}$ and the primary resistance $R_m$ may be performed through an operation for determining whether or not a difference between the secondary resistance $R_{m+1}$ and the primary resistance $R_m$ is equal to or larger than a preset value.

When the comparison result between the secondary resistance $R_{m+1}$ and the primary resistance $R_m$ is within a predetermined normal range of values, it may be determined that the current does not reach the maximum current level and the process may return to operation S32.

For example, the phrase that the comparison result between the secondary resistance $R_{m+1}$ and the primary resistance $R_m$ is within the normal range may mean that the ratio of the secondary resistance $R_{m+1}$ to the primary resistance $R_m$ is equal to or less than the fixed value. In another example, the phrase that the comparison result between the secondary resistance $R_{m+1}$ and the primary resistance $R_m$ is within the normal range may mean that the differential resistance between the secondary resistance $R_{m+1}$ and the primary resistance $R_m$ is within a preset value range.

When the comparison result between the secondary resistance $R_{m+1}$ and the primary resistance $R_m$ is not within the normal range, it may be determined that the current reaches the maximum current level. The maximum current level $I_j$ may be set as the current value $I_m$ according to the primary resistance Rm (S35). For example, the setting step is performed in the control apparatus included in the max current level measurement apparatus.

For example, the phrase that the comparison result between the secondary resistance $R_{m+1}$ and the primary resistance Rm is not within the normal range may mean that the ratio of the secondary resistance $R_{m+1}$ to the primary resistance $R_m$ is larger than the fixed value. In another example, the phrase that the comparison result between the secondary resistance $R_{m+1}$ and the primary resistance $R_m$ is not within the normal range may mean that the differential resistance between the secondary resistance $R_{m+1}$ and the primary resistance $R_m$ is not within the preset value range.

Figure 9:
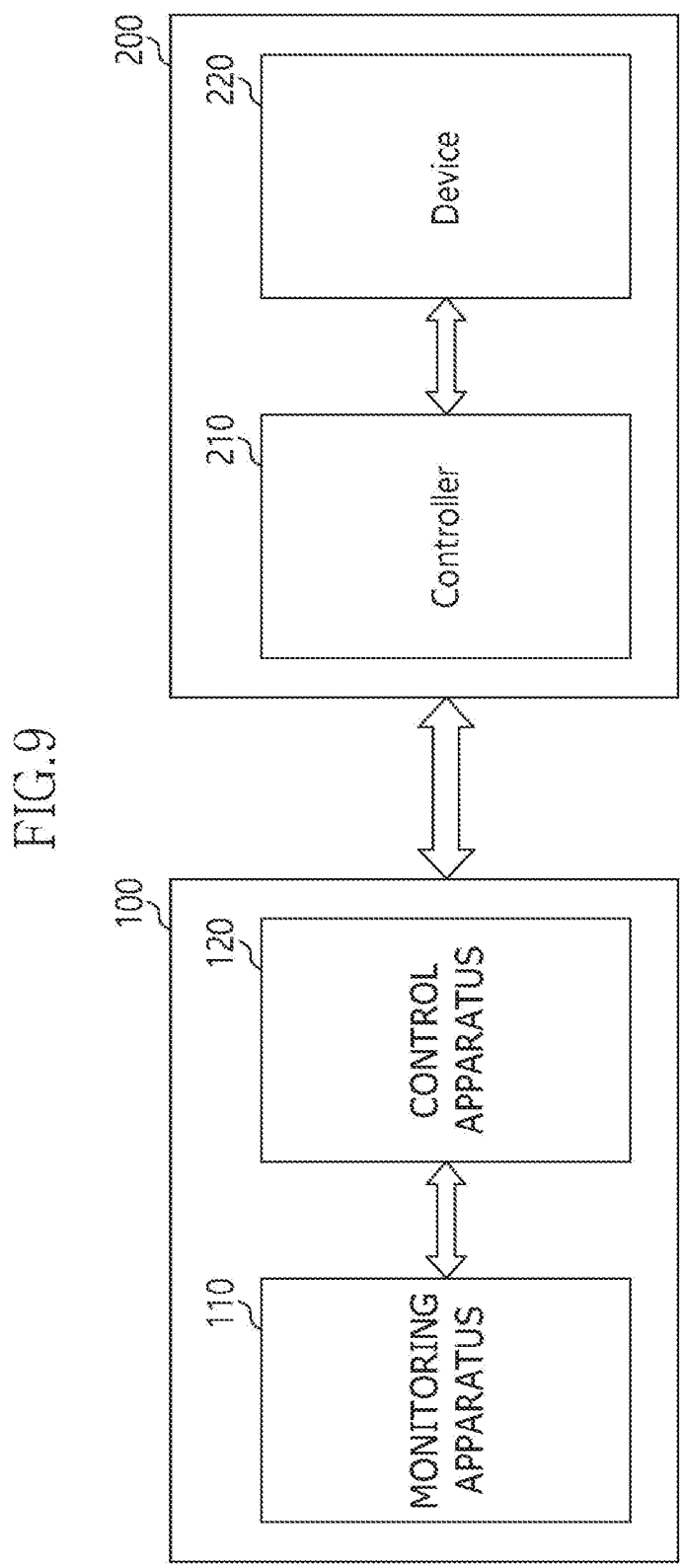
FIG. 9 is a schematic block diagram illustrating a maximum current level measurement apparatus and a semiconductor integrated circuit system according to an embodiment of the present disclosure.
Figure 11:
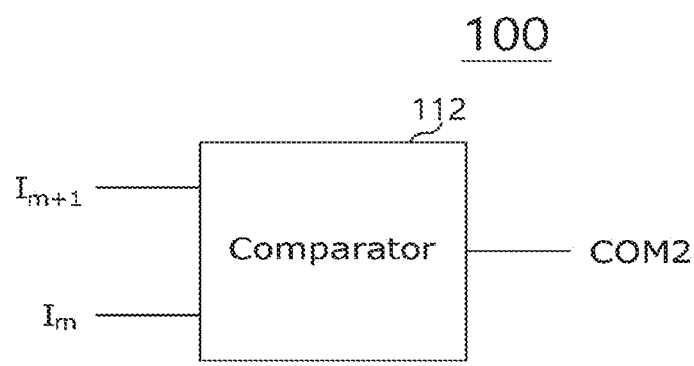
Figure 12:
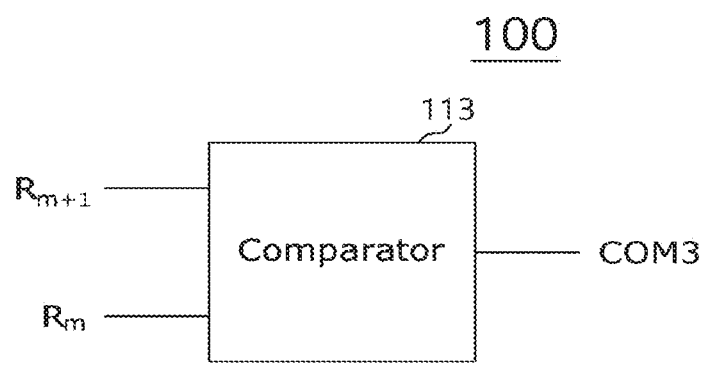

FIG. 9 is a schematic block diagram illustrating a maximum current level measurement apparatus and a semiconductor integrated circuit system according to an embodiment of the disclosure. FIG. 10 to FIG. 12 are schematic block diagrams illustrating a comparator included in the maximum current level measurement apparatus according to an embodiments of the present disclosure.

Referring to FIG. 9, a maximum current level measurement apparatus 100 may include a monitoring apparatus 110 and a control apparatus 120.

The monitoring apparatus 110 may monitor real-time voltage and current information applied to a semiconductor integrated circuit system 200.

The control apparatus 120 may include an operation block configured to calculate a real-time resistance and the like from the real-time voltage and current information provided from the monitoring apparatus 110 and a setting block configured to set a maximum current level through pieces of information provided from the operation block.

For example, the maximum current level measurement apparatus 100 may further include a comparator 111 for comparing a ratio $R_m/R_0$ and the preset value C, as a part of the control apparatus 120 and outputting a comparing result COM 1, referring to FIG. 3 and FIG. 10.

The maximum current level measurement apparatus 100 may further include a comparator 112 for comparing a primary current $I_m$ and a secondary current $I_{m+1}$, as a part of the control apparatus 120 and outputting a comparing result COM2, referring to FIG. 6 and FIG. 11.

Further, the maximum current level measurement apparatus 100 may include a comparator 113 for comparing primary resistance $R_m$ and the secondary resistance $R_{m+1}$, as a part of the control apparatus 120 and outputting a comparing result COM 3, referring to FIGS. 8 and 12. Further, the maximum current level measurement apparatus 100 includes a measuring circuit for measuring an initial resistance of the interconnection structure m1.

The maximum current level measurement apparatus 100 may be implemented in various forms. In an embodiment, for example, the maximum current level measurement apparatus 100 may be implemented with software, hardware, or any combination thereof.

The maximum current level measurement apparatus 100 may interface with the semiconductor integrated circuit system 200. Accordingly, the application of a spontaneous voltage or current close to the maximum current level of the semiconductor integrated circuit system 200 may be prevented. The semiconductor integrated circuit system 200 may include a controller 210 and a semiconductor device 220. The semiconductor device 220 may be controlled through the controller 210 which receives information provided from the maximum current level measurement apparatus 100. In an embodiment, for example, the semiconductor integrated circuit system 200 may be implemented with software, hardware, or any combination thereof.

The above described embodiments are intended to illustrate and not be limiting. Various alternatives and equivalents are possible. The embodiments not limited by the embodiments described herein. Nor is the disclosure limited to any specific type of semiconductor device. Other additions, subtractions, or modifications are obvious in view of the present disclosure and are intended to fall within the scope of the appended claims.

What is claimed is:

1. A method of extracting a maximum current level, the method comprising:
   starting, with a max current level measurement apparatus, voltage sweeping on an interconnection structure, the interconnection structure being at a certain temperature when the voltage sweeping is started;
   measuring an initial resistance of the interconnection structure;
   calculating, with the max current level measurement apparatus, a measured resistance of the interconnection structure according to a corresponding input voltage;
   determining, with the max current level measurement apparatus, whether or not a resistance ratio of the measured resistance of the interconnection structure to the initial resistance is equal to or less than a preset value;
   updating a current value corresponding to measured resistance to a potential maximum current level and repeating the step of calculating of the measured resistance of the interconnection structure when the resistance ratio of the interconnection structure is equal to or less than the preset value; and
   setting the current value corresponding to the measured resistance as the maximum current level when the resistance ratio of the interconnection structure is greater than the preset value.

2. The method of claim 1, wherein the preset value corresponds to a temperature variation ($\Delta T$), and the temperature variation ($\Delta T$) is obtained from the following equation, $$R_m = R_0 \times (1 + TCR \times \Delta T),$$

wherein R0 is the initial resistance, Rm is the measured resistance, Rm/R0 is the resistance ratio, and TCR is a temperature coefficient of resistance.

3. The method of claim 1, further comprising: calculating a measured current of the interconnection structure, wherein calculating the measured current of the interconnection structure includes measuring, through a monitoring equipment included in the max current level measurement, the corresponding input voltage and the current value corresponding to the measured resistance.

4. The method of claim 1, further comprising:
   calculating a measured current of the interconnection structure, wherein calculating the measured current of the interconnection structure includes measuring, through a monitoring apparatus included in the max current level measurement apparatus, the input voltage as a ratio of the input voltage to the current value corresponding to the measured resistance.

5. A method of extracting a maximum current level from a max current level measurement apparatus, the method comprising:
   starting, with the max current level measurement apparatus, voltage sweeping on an interconnection structure, the interconnection structure being at a certain temperature when the voltage sweeping is started;
   measuring, with the max current level measurement apparatus, a primary current of the interconnection structure according to an input voltage;
   measuring, with the max current level measurement apparatus, a secondary current of the interconnection structure according to next input voltage;
   determining, with the max current level measurement apparatus, whether or not a current difference is equal to or larger than zero, the current difference obtained by subtracting the primary current from the secondary current;

repeating the steps of measuring the primary current, measuring the secondary current, and determining whether or not the current difference is equal to or larger than zero when the current difference is equal to or greater than zero; and setting, with the max current level measurement apparatus, the primary current as a maximum current level when the current difference is less than zero.

6. A method of extracting a maximum current level from a max current level measurement apparatus, the method comprising:

starting, with the max current level measurement apparatus, voltage sweeping to an interconnection structure, the interconnection structure being at a certain temperature when the voltage sweeping is started;

measuring, with the max current level measurement, a primary resistance of the interconnection structure according to an input voltage;

measuring, with with the max current level measurement, a secondary resistance of the interconnection structure according to a subsequent input voltage;

comparing, with the max current level measurement apparatus, the primary resistance and the secondary resistance to generate a resistance comparison result; and repeating the steps of measuring the primary resistance, measuring the secondary resistance, and comparing the primary resistance and the secondary resistance or setting, with the max current level measurement apparatus, a maximum current level according to the resistance comparison result.

7. The method of claim 6, wherein the comparing includes determining whether or not a ratio of the secondary resistance to the primary resistance is equal to or larger than a fixed value.

8. The method of claim 6, wherein the comparing includes determining whether or not a difference between the secondary resistance and the primary resistance is equal to or larger than a preset value.

9. The method of claim 6, wherein the repeating the steps of measuring the primary resistance, measuring the secondary resistance, and comparing the primary resistance and the secondary resistance or setting of the maximum current level according to the resistance comparison result includes repeating the steps of measuring the primary resistance, measuring the secondary resistance, and comparing the primary resistance and the secondary resistance when the resistance comparison result is within a predetermined normal range of values and setting the current value corresponding to the primary resistance as the maximum current level when the resistance comparison result is out of the predetermined normal range of values.

10. The method of claim 9, wherein the resistance comparison result is within the normal range when the ratio of the secondary resistance to the primary resistance is equal to or less than a fixed value.

11. The method of claim 9, wherein the resistance comparison result is within the normal range when a difference between the secondary resistance and the primary resistance is within a predetermined value range.

12. The method of claim 9, wherein the resistance comparison result is out of the normal range when the ratio of the secondary resistance to the primary resistance is larger than a fixed value.

13. The method of claim 9, wherein the resistance comparison result is out of the normal range when the difference between the secondary resistance $R_{m+1}$ and the primary resistance $R_m$ is not within a predetermined value range.

* * * * *